United States Patent
Pickett et al.

(10) Patent No.: US 6,838,950 B2
(45) Date of Patent: Jan. 4, 2005

(54) VOLTAGE-CONTROLLED OSCILLATOR HAVING TUNABLE RESONATOR AND POWER GAIN ELEMENT

(75) Inventors: Michael N. Pickett, Fountain Hills, AZ (US); Robert H. Bickley, Paradise Valley, AZ (US)

(73) Assignee: General Dynamics Decision Systems, Inc., Scottsdale, AZ (US)

( * ) Notice: Subject to any disclaimer, the term of this patent is extended or adjusted under 35 U.S.C. 154(b) by 78 days.

(21) Appl. No.: 10/269,136

(22) Filed: Oct. 10, 2002

(65) Prior Publication Data

US 2004/0070463 A1 Apr. 15, 2004

(51) Int. Cl.[7] .................................................. H03B 5/00
(52) U.S. Cl. .............................. 331/117 R; 331/177 V; 331/117 FE; 331/167
(58) Field of Search ...................... 331/117 R, 117 FE, 331/177 V, 167, 116 R, 116 FE

(56) References Cited

U.S. PATENT DOCUMENTS

| 4,550,293 A | * 10/1985 | Driscoll ................... 331/116 R |
| 5,218,325 A | 6/1993 | Trelewicz et al. ..... 331/117 FE |

* cited by examiner

Primary Examiner—Arnold Kinkead
(74) Attorney, Agent, or Firm—Bryan Cave LLP

(57) ABSTRACT

A voltage-controlled oscillator in which a tunable resonator (102) having a first port (132) and a second port (106) is disclosed. In one embodiment, the tunable resonator is a series resonating circuit having low driving and load impedances. A power gain element (108) is coupled to the first port and the second port, and an output port (110) is coupled to the power gain element and the second port. The first impedance at the first and second ports is less than approximately ten ohms. The voltage-controlled oscillator is capable of generating a signal at the output port of greater than approximately half a watt.

20 Claims, 1 Drawing Sheet

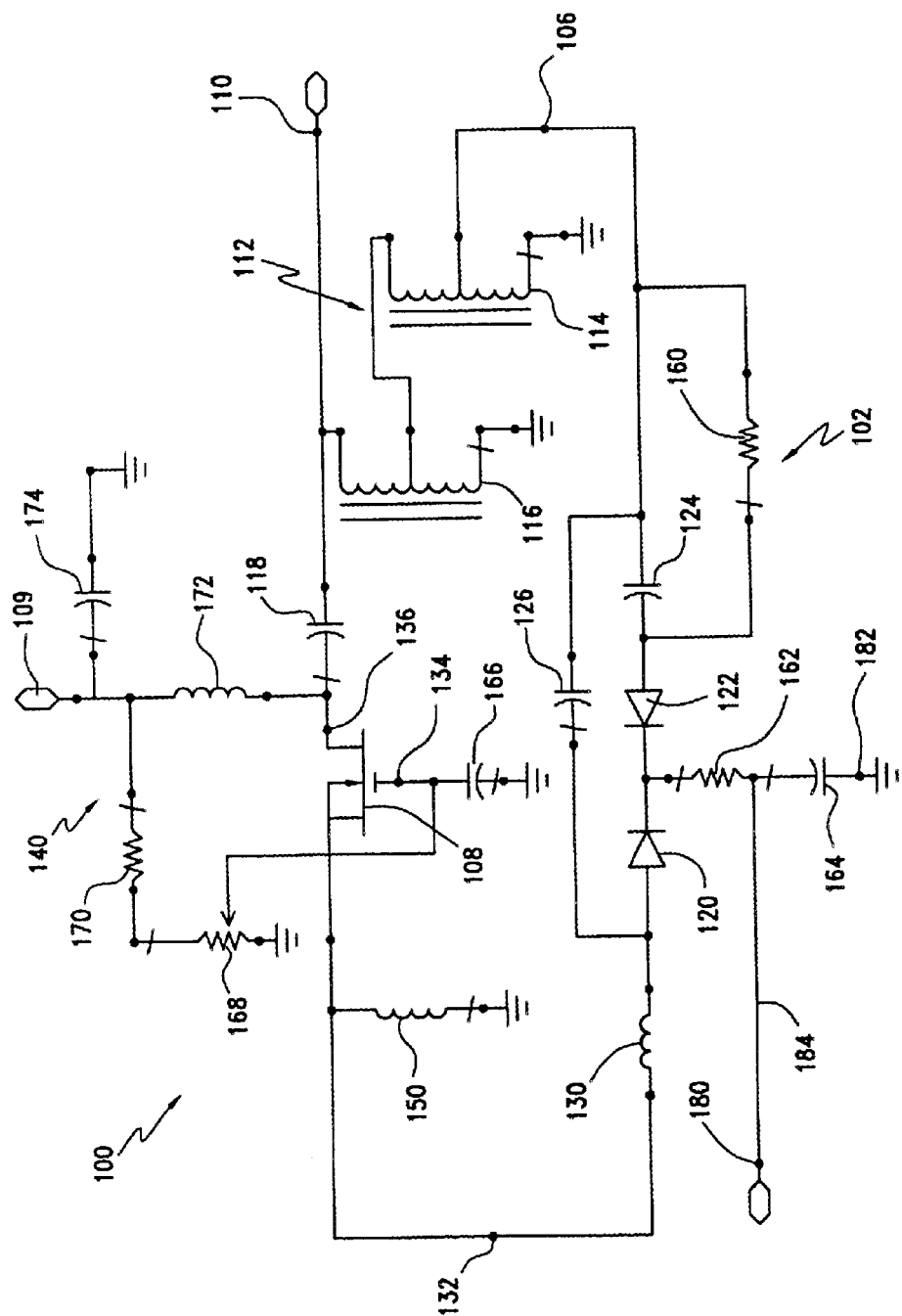

VOLTAGE-CONTROLLED OSCILLATOR HAVING TUNABLE RESONATOR AND POWER GAIN ELEMENT

FIELD OF THE INVENTION

This invention relates in general to radio transmitters and receivers, and in particular to a voltage-controlled oscillator for use in radio communications equipment.

BACKGROUND OF THE INVENTION

As the rate of information exchange increases, the portion of the electromagnetic spectrum used for wireless communications has become increasingly more crowded. The large number of individuals and entities that wish to use the spectrum to transmit and receive data has led to the institution of assigned channels, or frequency bands, dedicated to carry particular kinds of traffic and designed to minimize interference among the different transmissions. The growing number of frequency bands requires the bands to be spaced together as closely as possible in order to maximize the spectrum's capacity to carry information. This dense spacing means that the noise floor of transmitters, receivers, and other communication system components must be kept low enough that the noise generated by the components does not overwhelm other components of nearby systems. A component with a high noise floor will tend to desensitize any nearby receiver operating in that component's frequency band.

The collocation requirements of various frequency bands can be quite strict. In general, fixed-site base station radios require a very low noise floor to meet the collocation requirements of the various transmitter-receiver installations. The Air Traffic Control (ATC) band, located approximately between 118 MegaHertz (MHz) and 137 MHz, is just one example of a frequency band that demands low noise. A voltage-controlled oscillator (VCO), part of the frequency synthesizer in radio communications equipment, is found in both transmitters and receivers. The VCO generally sets the noise floor of the radio, whether it be the transmitter noise floor or the receiver local oscillator noise floor, both of which have an effect on collocation. Current technology attempts to achieve the required low noise floors by making use of bulky, expensive, manually-tuned filters to filter the frequency source. Accordingly, a need exists for a VCO capable of meeting the collocation requirements of various frequency bands without requiring manually tuned filters.

BRIEF DESCRIPTION OF THE DRAWING

The invention will be better understood from a reading of the following detailed description, taken in conjunction with the accompanying FIGURE in which is illustrated a schematic view of a voltage-controlled oscillator configured according to an embodiment of the present invention.

For simplicity and clarity of illustration, the drawing FIGURE illustrates the general manner of construction, and descriptions and details of well-known features and techniques are omitted to avoid unnecessarily obscuring the invention. Additionally, elements in the drawing FIGURE are not necessarily drawn to scale. For example, the dimensions of some of the elements in the FIGURE may be exaggerated relative to other elements to help to improve understanding of embodiments of the present invention.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein. The terms left, right, front, back, top, bottom, over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein. The term coupled, as used herein, is defined as directly or indirectly connected in an electrical or non-electrical manner.

DETAILED DESCRIPTION OF THE DRAWING

A particular embodiment of the voltage-controlled oscillator disclosed herein comprises a tunable resonator having a first port and a second port. A power gain element is coupled to the first port and the second port, and an output port is coupled to the power gain element and the second port. A first impedance at the first and second ports is less than approximately ten ohms. The voltage-controlled oscillator is capable of generating a signal at the output port of greater than approximately half a watt. This configuration allows a lower-cost, remotely tunable design that meets the collocation requirements of sensitive frequency bands.

Referring now to the sole FIGURE, a voltage-controlled oscillator (VCO) 100 comprises a tunable resonator 102 having a first port 132 and a second port 106. A power gain element 108 is coupled to first port 132 and second port 106. An output port 110 is coupled to power gain element 108. VCO 100 further comprises a power supply 109, which in one embodiment may supply 15 volts direct current (DC) to VCO 100. The impedance at first port 132 and second port 106 is, in one embodiment, less than approximately ten ohms, and in another embodiment, less than approximately five ohms. VCO 100 is capable of generating a signal at output port 110 of greater than half a watt.

It is well known in the art that oscillators require feedback to sustain oscillation. It is conventional to use a parallel resonant circuit in the feedback path for the oscillator in radio communications equipment. The quality factor (Q) of the resonant circuit determines how fast the noise falls off. Higher Q values lead to faster noise drop-off as the noise measurement frequency is offset from the tuned frequency of the oscillator, meaning loaded Q values for the resonator are kept as high as possible. For a conventional parallel resonant circuit, high Q values are maintained by lightly tapping into the circuit. In at least one embodiment of the invention, however, tunable resonator 102 comprises a series resonant circuit. In the series resonant circuit configuration, the maximum loaded Q of tunable resonator 102 is achieved when both the driving impedance and the load impedance are as low as possible. The low noise floors obtainable with the present invention are due, in part, to maintaining low driving and load impedances and thus achieving high Q values for tunable resonator 102. As explained in more detail hereinafter, operating the series resonant circuit at a very low impedance allows a first varactor diode 120 and a second varactor diode 122 to operate at a practical peak voltage level with a relatively high power output level between one half and two watts.

In one embodiment of the invention, the impedance at first port 132 and second port 106 is less than approximately five ohms. More particularly, the drive impedance seen by second port 106 is derived from the output of power gain element 108. This output is passed through a transformer element 112 that reduces the impedance, as mentioned, to a value below five ohms in one embodiment. In a particular aspect, transformer element 112 comprises a first transformer 114 coupled to a second transformer 116. Transformer element 112 may be, in one embodiment, a 16:1 impedance transformer, so that, for example, a 50 ohm driving impedance of power gain element 108 becomes a driving point impedance of 3.125 ohms seen by tunable resonator 102. An impedance reduction of lesser or greater magnitude could be performed in another embodiment of the invention. One of ordinary skill in the art will be readily able to identify numerous additional transformer topologies, together with their associated costs, suitable for use in selecting a driving impedance for a tunable resonator in a VCO. A first capacitor 118 may be included between power gain element 108 and transformer element 112. First capacitor 118 passes the alternating current (AC) signal and blocks the DC signal in VCO 100.

In one embodiment, power gain element 108 has a noise figure of less than approximately five decibels (dB). In another embodiment, power gain element 108 has a noise figure of less than approximately two dB. Power gain element 108 may, in one embodiment of the invention, comprise a bipolar transistor, and, in another embodiment, comprise a field effect transistor (FET).

In a particular embodiment of the invention, tunable resonator 102 comprises a first inductor 130 coupled in series with first varactor diode 120. Tunable resonator 102 further comprises second varactor diode 122 coupled in series to first varactor diode 120 in a back-to-back configuration. The back-to-back configuration linearizes the varactors and increases the voltage rating over a single varactor diode by a factor of two. In at least one embodiment, each of first varactor diode 120 and second varactor diode 122 may be selected to have a high capacitance tuning ratio of approximately fifteen to one. One of ordinary skill in the art will recognize that other voltage-controlled or current-controlled devices may be used in place of first varactor diode 120 and second varactor diode 122. Tunable resonator 102 also comprises a second capacitor 124 coupled in series between second varactor diode 122 and second port 106. Tunable resonator 102 further comprises a third capacitor 126 coupled in parallel with first varactor diode 120, second varactor diode 122, and second capacitor 124. Coupling capacitors in series and in parallel to first varactor diode 120 and second varactor diode 122 helps limit the tuning range of tunable resonator 102. Limiting the tuning range in this fashion has the effect of maximizing the Q of the circuit, because much of the current then flows through the fixed, higher-Q capacitors rather than the lower-Q varactor diodes, resulting in a lower noise floor. More particularly, first varactor diode 120 and second varactor diode 122 have a tuning range that may be reduced by the selection and arrangement of capacitors, such as second capacitor 124 and third capacitor 126. The capacitor placement described reduces the voltage across and the current through first and second varactor diodes 120 and 122, thus raising the Q value of tunable resonator 102. Varactors in general have relatively low Q values, giving increased importance to the particular capacitor placement chosen. The range for the tuning voltage for the circuit shown in the FIGURE varies approximately between 2 and 15 volts, supplied at an input 180. It should be noted, however, that the only limit on the tuning voltage, which includes the peak AC voltage, is the value of the breakdown voltage that first varactor diode 120 and second varactor diode 122 can sustain.

First transformer 114 is coupled to second capacitor 124 and third capacitor 126 via second port 106, and second transformer 116 is coupled to first transformer 114, as first disclosed hereinabove. First capacitor 118 is coupled to second transformer 116, and output port 110 is coupled to first capacitor 118 and second transformer 116. First inductor 130 is coupled in series to third capacitor 126 and first varactor diode 120. Power gain element 108 has a first terminal 132 coupled in series to first inductor 130, a second terminal 134 coupled to a bias circuit 140, and a third terminal 136 coupled in series to first capacitor 118. Bias circuit 140, in one embodiment, comprises a third resistor 168 coupled in series to a fourth resistor 170. Fourth resistor 170 is then coupled to power supply 109. Bias circuit 140 also comprises a third inductor 172 coupled to power supply 109 and to third terminal 136, first capacitor 118, and a fourth capacitor 174.

As mentioned hereinabove, power gain element 108 may comprise, in one embodiment, a FET and in another embodiment comprise a bipolar transistor. In an embodiment wherein power gain element 108 comprises a bipolar transistor, first terminal 132 is an emitter terminal of the transistor, second terminal 134 is a base terminal of the transistor, and third terminal 136 is a collector terminal of the transistor. In an embodiment wherein power gain element 108 comprises a FET, first terminal 132 is a source terminal of the transistor, second terminal 134 is a gate terminal of the transistor, and third terminal 136 is a drain terminal of the transistor. In this FET embodiment, first terminal 132, or the source terminal, has a low native impedance. Depending on the operating frequency, the source impedance may be approximately one or two ohms. A second inductor 150 may be coupled to first terminal 132 of this FET embodiment such that second inductor 150 acts as a DC path to allow power gain element 108 to be placed at an appropriate operating current. More particularly, the voltage on second terminal 134 may be adjusted to set the bias current through power gain element 108, thereby setting the desired output power at third terminal 136. The power at output port 110 may be selected, in one embodiment, to lie in the range between half a watt and two watts. In a particular embodiment, the output power at output port 110 is approximately equal to one watt. If power gain element 108 is properly selected and biased, VCO 100 will oscillate as desired.

The high power output described immediately above is one characteristic that differentiates VCO 100 from conventional voltage-controlled oscillators, most of which operate at under 100 milliwatts (mW). A power output of greater than 0.5 Watts (W) places VCO 100 well above the noise floor, because, as is well known in the art, the higher the level at which the signal is generated the farther it is above the thermal noise floor. Of course, operating VCO 100 near 1 W requires a significant amount of power, leading to, among other things, short battery life. VCO 100, therefore, is better suited, in at least one embodiment, to high-quality base station and vehicle-mounted operations than to handheld-type applications. In another embodiment, VCO 100 may be optimized for portable radio units such as man-pack radios.

VCO 100, in a particular aspect, may be optimized for the Air Traffic Control (ATC) band used by the Federal Aviation Administration (FAA) to control air traffic everywhere in the United States. The ATC band extends from approximately 118 MHz to approximately 137 MHz, and has fairly stringent collocation requirements. In a particular embodiment, the ATC band optimization may be accomplished by selecting second capacitor 124 having an approximate 15 pico-Farad (pF) fixed capacitance and third capacitor 126 having an approximate 6.8 pF fixed capacitance. First inductor 130 may have an inductance of approximately 100 nanoHenries (nH), and second inductor 150 may have an inductance of approximately 470 nH. Tunable resonator 102 may also include a first resistor 160 having a resistance of approximately 475,000 ohms and a second resistor 162 having a resistance of approximately 10,000 ohms. First resistor 160 allows a DC bias path for second varactor diode 122, and second resistor 162 acts as a bias resistor to couple first and second varactor diodes 120 and 122 to the tuning voltage at input 180. First resistor 160 and second resistor 162 are selected to have high resistances, in at least one embodiment, so that they do not become a power dissipating element that would affect the Q of the illustrated circuit. A fourth capacitor 164 may be added to VCO 100 to filter noise off of a control line 184 going into tunable resonator 102. A fifth capacitor 166 may be coupled to second terminal 134 to provide a low AC impedance at second terminal 134. Fourth capacitor 164 and fifth capacitor 166 may each have a capacitance of approximately 1000 pF. Referring still to an embodiment wherein VCO 100 is optimized for the ATC band, third resistor 168 and fourth resistor 170 may each have a resistance of approximately 5000 ohms, while third inductor 172 has an inductance of approximately 470 nH and fourth capacitor 174 has a capacitance of approximately 1000 pF. Power gain element 108 may comprise an MRF282 FET, available from Motorola, Inc. Although VCO 100 has just been described as optimized for the ATC band, VCO 100 is scalable over a wide frequency band, and one of ordinary skill in the art will recognize that the invention may be optimized to applications in a broad range of frequencies.

Although the invention has been described with reference to specific embodiments, it will be understood by those skilled in the art that various changes may be made without departing from the spirit or scope of the invention. For instance, the numerous details set forth herein such as, for example, the particular resistance, capacitance, and inductance values, and the particular component configurations are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Furthermore, the terms "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

All elements claimed in the claims are considered essential to the invention, and replacement of one or more claimed elements constitutes reconstruction and not repair of the claimed invention. Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A voltage-controlled oscillator comprising:
a tunable resonator having a first port and a second port;
a power gain element coupled to the first port and the second port; and
an output port coupled to the power gain element and the second port,
wherein:
the tunable resonator has a first impedance and a second impedance at the first and second ports;
the first impedance is less than approximately ten ohms; and
the voltage-controlled oscillator is capable of generating a signal at the output port of greater than approximately 0.5 watts.

2. The voltage-controlled oscillator of claim 1 wherein: the first impedance is less than approximately five ohms.

3. The voltage-controlled oscillator of claim 1 wherein: the power gain element has a noise figure of less than approximately five dB.

4. The voltage-controlled oscillator of claim 1 wherein: the power gain element has a noise figure of less than approximately two dB.

5. The voltage-controlled oscillator of claim 1 wherein: the power gain element is a field effect transistor.

6. The voltage-controlled oscillator of claim 1 wherein: the power gain element is a bipolar transistor.

7. The voltage-controlled oscillator of claim 1 wherein: the tunable resonator is optimized for an air traffic control band.

8. The voltage-controlled oscillator of claim 1 wherein: the tunable resonator comprises a varactor diode; and the varactor diode has a tuning ratio of approximately 15:1.

9. The voltage-controlled oscillator of claim 1 wherein: the power gain element comprises an MRF282 FET.

10. The voltage-controlled oscillator of claim 1 wherein: the first impedance is less than the second impedance by a factor of approximately sixteen.

11. A voltage-controlled oscillator comprising:
a first varactor diode;
a second varactor diode coupled in series to the first varactor diode in a back-to-back configuration;
a first capacitor coupled in series to the second varactor diode;
a second capacitor coupled in parallel with the first varactor diode, the second varactor diode, and the first capacitor;
a first transformer coupled to the first and second capacitors;
a second transformer coupled to the first transformer;
a third capacitor coupled to the second transformer;
an output port coupled to the third capacitor and the second transformer;
an inductor coupled in series to the second capacitor and the first varactor diode;
a bias circuit; and
a transistor having a first terminal coupled in series to the inductor, a second terminal coupled in series to the bias circuit, and a third terminal coupled in series to the third capacitor.

12. The voltage-controlled oscillator of claim 11 wherein:

the transistor is a field effect transistor;

the first terminal is a source terminal of the transistor;

the second terminal is a gate terminal of the transistor; and the third terminal is a drain terminal of the transistor.

13. The voltage-controlled oscillator of claim 11 wherein:

the transistor is a bipolar transistor;

the first terminal is an emitter terminal of the transistor;

the second terminal is a base terminal of the transistor; and the third terminal is a collector terminal of the transistor.

14. The voltage-controlled oscillator of claim 11 further comprising:

a first port between the first varactor diode and the first inductor; and a second port between the first transformer and the first capacitor, wherein an impedance at the first port and at the second port is less than approximately ten ohms.

15. The voltage-controlled oscillator of claim 14 wherein:

the impedance at the first port and at the second port is less than approximately five ohms.

16. The voltage-controlled oscillator of claim 11 wherein:

the transistor has a noise figure of less than approximately five dB.

17. The voltage-controlled oscillator of claim 11 wherein:

the transistor has a noise figure of less than approximately two dB.

18. The voltage-controlled oscillator of claim 11 wherein:

the first capacitor and the second capacitor are configured for operating the voltage-controlled oscillator in an air traffic control band.

19. The voltage-controlled oscillator of claim 11 wherein:

the first transformer and the second transformer comprise a 16:1 impedance transformer.

20. The voltage-controlled oscillator of claim 11 wherein:

the first varactor diode has a tuning ratio of approximately 15:1.

* * * * *